United States Patent
Lim et al.

(10) Patent No.: US 8,432,471 B2
(45) Date of Patent: Apr. 30, 2013

(54) CMOS IMAGE SENSOR AND IMAGE SIGNAL DETECTING METHOD

(75) Inventors: Seung hyun Lim, Seoul (KR); Jeong hwan Lee, Seoul (KR); Kun hee Cho, Seoul (KR); Gun Hee Han, Goyang-si (KR); Kwi Sung Yoo, Seoul (KR); Seog heon Ham, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 378 days.

(21) Appl. No.: 12/828,478

(22) Filed: Jul. 1, 2010

(65) Prior Publication Data

US 2011/0043676 A1  Feb. 24, 2011

(30) Foreign Application Priority Data

Aug. 24, 2009 (KR) ........................ 10-2009-0078192

(51) Int. Cl.
*H04N 3/14* (2006.01)

(52) U.S. Cl.
USPC ............................ 348/308; 348/301; 348/241

(58) Field of Classification Search .................. 348/301, 348/308, 241
See application file for complete search history.

(56) References Cited

U.S. PATENT DOCUMENTS

| | | | |
|---|---|---|---|
| 6,821,808 B2 | 11/2004 | Nakamura et al. | |
| 7,301,487 B2 | 11/2007 | Funakoshi et al. | |
| 2002/0118289 A1 | 8/2002 | Choi | |
| 2007/0007434 A1 | 1/2007 | Pain | |
| 2008/0111059 A1* | 5/2008 | Lee et al. ............... | 250/214 DC |
| 2009/0256735 A1* | 10/2009 | Bogaerts .................... | 341/169 |

FOREIGN PATENT DOCUMENTS

| | | |
|---|---|---|
| JP | 06153096 A | 5/1994 |
| JP | 2000152090 A | 5/2000 |
| JP | 2001078096 A | 3/2001 |
| JP | 2001203936 A | 7/2001 |
| JP | 2001230936 A | 8/2001 |
| JP | 2002330348 A | 11/2002 |
| JP | 2003174596 A | 6/2003 |
| JP | 2008136042 A | 6/2008 |
| KR | 1020060104197 A | 10/2006 |
| KR | 1020070028210 A | 3/2007 |

* cited by examiner

*Primary Examiner* — Roberto Velez
*Assistant Examiner* — Yih-Sien Kao
(74) *Attorney, Agent, or Firm* — Volentine & Whitt, PLLC

(57) ABSTRACT

A CMOS image sensor includes a photodiode, a switch configured to transfer a signal sensed by the photodiode to a sensing node, and a comparator electrically and directly connected to the sensing node and configured to compare the sensed signal of the sensing node and a ramp signal. Reset offset of the comparator is maintained at a constant offset voltage level during an initialization mode.

17 Claims, 5 Drawing Sheets

CMOS IMAGE SENSOR AND IMAGE SIGNAL DETECTING METHOD

CROSS-REFERENCE TO RELATED APPLICATIONS

This U.S. non-provisional patent application claims priority under 35 U.S.C. §119 to Korean Patent Application No. 10-2009-0078192, filed on Aug. 24, 2009, the subject matter of which is hereby incorporated by reference.

BACKGROUND

The present disclosure relates to Complementary Metal Oxide Semiconductor (CMOS) image sensors and, more specifically, to CMOS image sensors incorporating a comparator configured to reduce reset offset between pixels.

CMOS image sensors are widely used in digital cameras to convert optical signals into corresponding electrical signals. This conversion occurs in so-called "pixels" of the CMOS image sensor. Each image pixel is associated with a photodiode and read-out circuit, wherein the photodiode generates an electrical charge in relation to absorbed incident light. The charge generated by the photodiode is then converted into an analog voltage and transferred to the read-out circuit. The read-out circuit converts the analog voltage into a voltage waveform indicative of a digital value using an analog-to-digital (A/D) conversion process.

In certain devices, the A/D conversion is performed by comparing the analog voltage of a pixel to a reference ramp voltage using a comparator circuit. A counted value is generated over a period of time that it takes for the increasing/decreasing ramp voltage to reach to the same level as the analog voltage. This time-wise counted value may be used as a digital data value equivalent (or representation) of the analog voltage.

Generally, each pixel of a CMOS image sensor is implemented by a structure including four (4) N-type MOS transistors (NMOS). A first NMOS transistor is used to initialize the pixel. A second NMOS transistor is used to transfer image information (e.g., electrical charge) from the pixel. A third NMOS transistor is used to select the pixel, and a fourth NMOS transistor in a source follower configuration is used as a buffer for transferring the image information from the pixel.

However, when a pixel transfers a sensing signal (e.g., a floating diffusion) to the read-out circuit through the NMOS source follower, the corresponding response signal is limited in its dynamic range and noise increases.

SUMMARY

Embodiments of the inventive concept provide improved CMOS image sensors. In certain embodiments of the inventive concept, the CMOS image sensor may include a photodiode, a switch configured to transfer a signal sensed by the photodiode to a sensing node, and a comparator electrically and directly connected to the sensing node and configured to compare the sensed signal of the sensing node and a ramp signal. Reset offset of the comparator is maintained at a constant offset voltage level during an initialization mode.

The present disclosure also provides a method for detecting an image signal of a CMOS image sensor. In some embodiments of the inventive concept, the method may include initializing a sensing node and setting reset offset corresponding to the initialized sensing node to a predetermined voltage level and converting the predetermined voltage level into a digital signal.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION OF THE EMBODIMENTS

Figure 1:
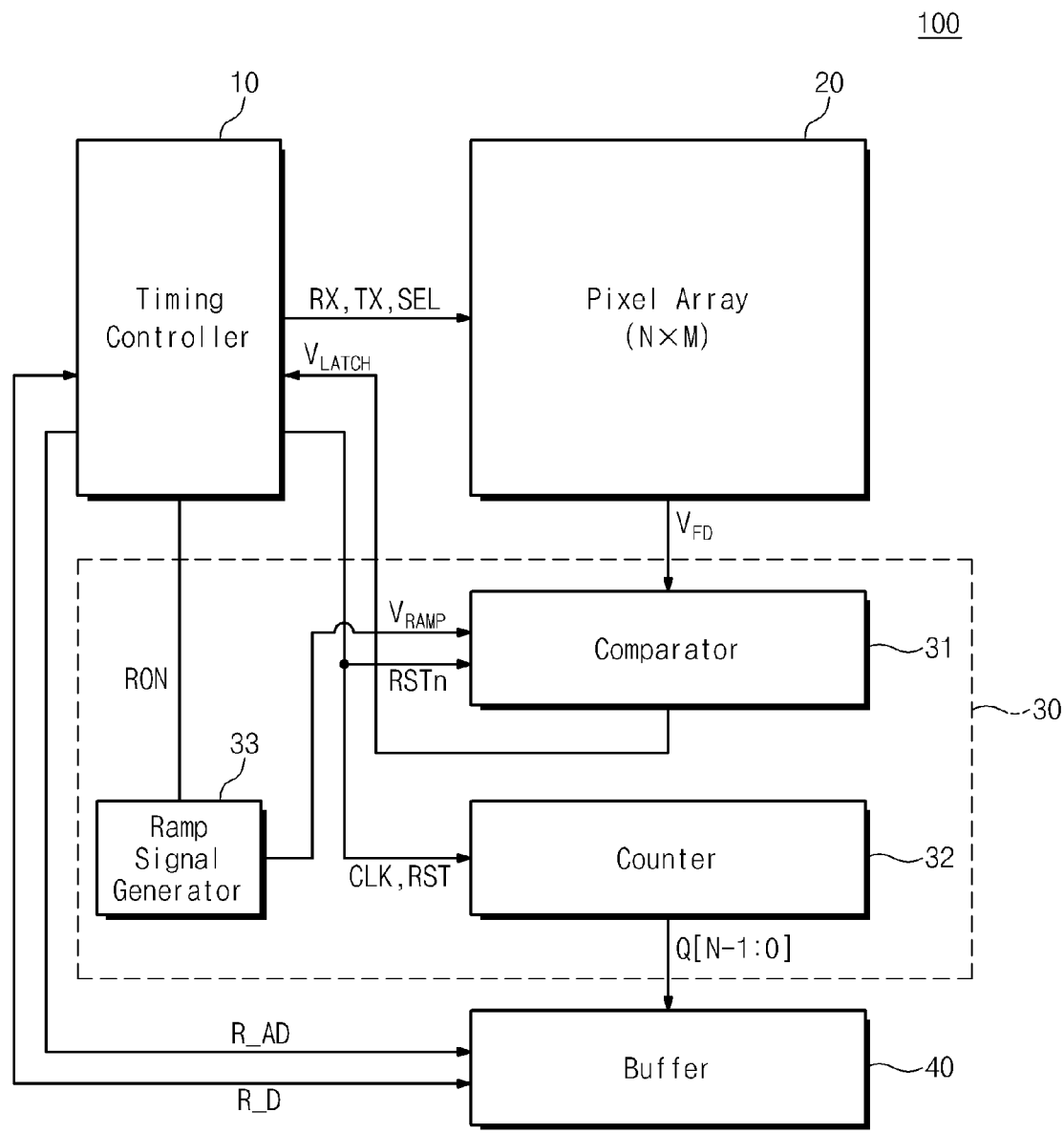
FIG. 1 is a block diagram of a CMOS image sensor according to an exemplary embodiment of the inventive concept.

Certain embodiments of the inventive concept will now be described is some additional detail with reference to the accompanying drawings. However, the inventive concept may be embodied in many different forms and should not be construed as being limited only to the illustrated embodiments. Rather, these embodiments are provided as examples to convey the making and use of the inventive concept to one of ordinary skill in the art. Accordingly, known processes, elements, and techniques are not described with respect to some of the embodiments of the inventive concept. Throughout the drawings and written description, like reference numerals will be used to refer to like or similar elements unless otherwise specified.

FIG. 1 is a block diagram of a CMOS image sensor 100 according to an embodiment of the inventive concept. As illustrated, the CMOS image sensor 100 includes a timing controller 10, a pixel array 20, an analog-to-digital converter (ADC) 30, and a buffer 40.

The timing controller 10 controls the pixel array 20 according to certain control signals, e.g., RX, TX, and SEL. The timing controller 10 controls the ADC 30 according to additional control signals, e.g., RON, CLK, and RST, and the timing controller 10 controls the buffer 40 according to, e.g., a control signal R_AD. Those skilled in the art will recognize that these well understood control signals are merely representative of a broad class of control signals that might be used to effect respective control and interoperability of the exemplary circuit blocks shown in FIG. 1.

In operation, the pixel array 20 senses the optical signals associated with an external image and transfers a corresponding sensing signal (floating diffusion) to the ADC 30. One example of a possible constitution of the individual pixels forming the pixel array 20 will be described in some additional detail hereafter with reference to FIG. 2.

In the illustrated embodiment of FIG. 1, the ADC 30 comprises a comparator 31, a counter 32, and a ramp signal generator 33.

In view of this configuration, the pixel array 20 transfers the sensing signal (floating diffusion) $V_{FD}$ to the comparator 31 in response to the control signals RX, TX, and SEL. The comparator 31 receives the sensing signal $V_{FD}$ and a ramp signal $V_{RAMP}$ from the ramp signal generator 33. The ramp signal $V_{RAMP}$ is characterized by a voltage level that rises and/or falls over a defined time period. In the illustrated embodiment of FIG. 1, the ramp signal $V_{RAMP}$ is assumed to fall during a defined time period.

The counter 32 begins counting from the point at which the comparator 31 compares the sensing signal $V_{FD}$ with the ramp signal $V_{RAMP}$ in response to control signals CLK and RST. That is, the comparator 31 compares the sensing signal $V_{FD}$ with the ramp signal $V_{RAMP}$ and then transfers a resulting comparison signal $V_{LATCH}$ corresponding to a voltage difference between the sensing signal $V_{FD}$ and the ramp signal $V_{RAMP}$ to the timing controller 10. The counter 32 stops counting in response to the control signal CLK provided from the timing controller 10. A counted value stored in the counter 32 is digital data corresponding to the sensing signal $V_{FD}$. The analog signal converted into the digital data is stored in the buffer 40. The timing controller 10 transfers a control signal R_AD, and receives a data signal R_D.

Possible circuit structures for the pixel array 20 and comparator 31 will now be described with reference to FIG. 2.

Figure 2:
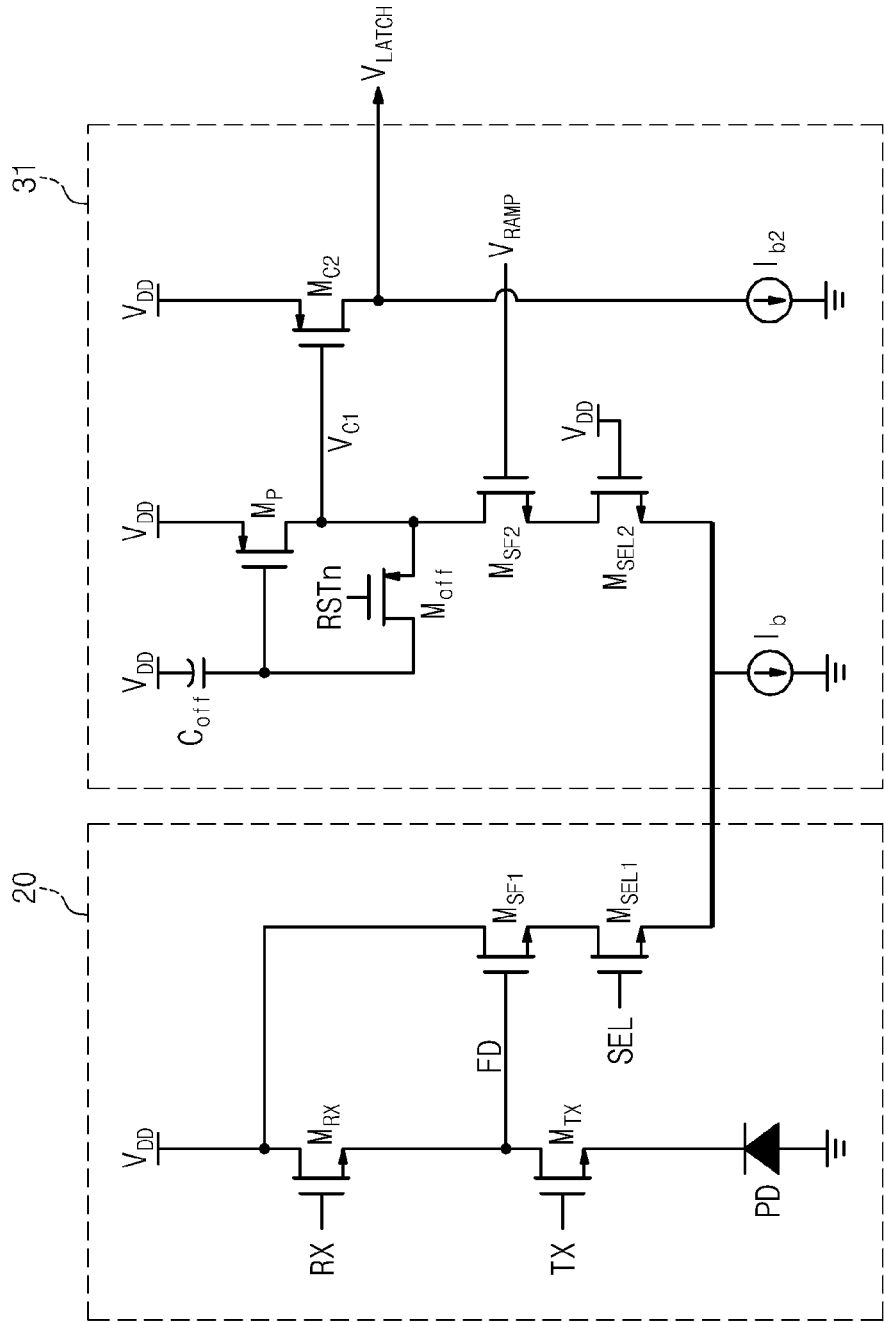
FIG. 2 is a circuit diagram of a pixel in a pixel array and a comparator shown in FIG. 1.

FIG. 2 is a circuit diagram further illustrating one possible circuit structure for both the pixel array 20 and comparator 31 of FIG. 1. Thus, the pixel circuit shown in FIG. 2 implements one pixel of the N by M pixel array 20.

Referring collectively to FIGS. 1 and 2, the exemplary circuit structure of pixel 20 of the N by M pixel array comprises four (4) NMOS transistors $M_{RX}$, $M_{TX}$, $M_{SF1}$, and $M_{SEL1}$ and a photodiode PD.

The transistor $M_{RX}$ is coupled between a power supply voltage $V_{DD}$ and a sensing node FD and controlled by a control signal RX. The transistor $M_{RX}$ initializes the pixel 20 in response to the control signal RX.

The transistor $M_{TX}$ is coupled between the sensing node FD and the photodiode PD and controlled by a control signal TX. The transistor $M_{TX}$ transfers a sensing signal $V_{FD}$ to the sensing node FD in response to the control signal TX.

The transistor $M_{SF1}$ is coupled between the power supply voltage $V_{DD}$ and the transistor $M_{SEL}$ and controlled by the sensing node FD. The transistor $M_{SF1}$ and a current source Ib constitute a source follower. The source follower functions as a buffer. That is, if a voltage of the sensing node FD is a power supply voltage $V_{DD}$, a sensing signal $V_{FD}$ transferred to a comparator 31 corresponds to a difference between the power supply voltage $V_{DD}$ and a threshold voltage of the transistor $M_{SF1}$. Thus, a dynamic range of the sensing node FD input to a gate of the transistor $M_{SF1}$ is limited.

Because the sensing signal $V_{FD}$ passing the sensing node FD is transferred to the comparator 31 through the transistors $M_{SF1}$ and $M_{SEL1}$, it may contain noise induced by the transistors $M_{SF1}$ and $M_{SEL1}$.

The transistor $M_{SEL1}$ is coupled between the transistor $M_{SF1}$ and the current source and controlled by the control signal SEL. The transistor $M_{SEL1}$ selects one of pixels in response of the control signal SEL.

The timing controller 10 activates the control signal RX to initialize the sensing node FD. The pixel 20 outputs the initialized sensing signal $V_{DD}$ to the comparator 31. The comparator 31 compares the sensing signal $V_{FD}$ with a ramp signal $V_{RAMP}$. The comparator 31 will be described below in detail with reference to FIG. 3.

Figure 3:
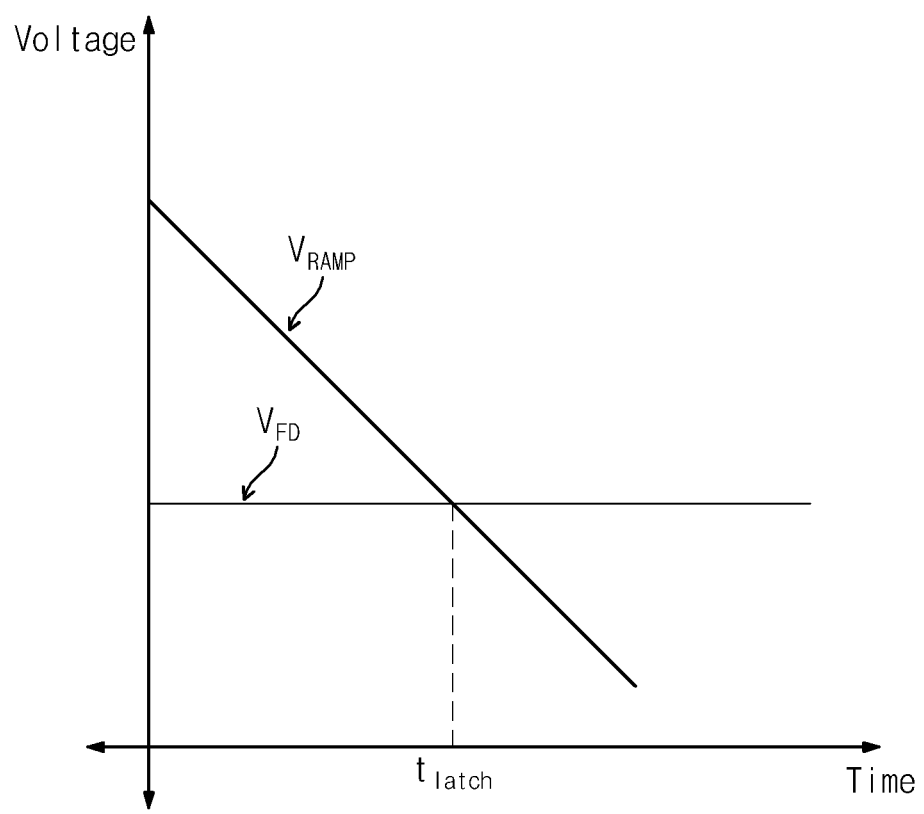
FIG. 3 is a graphic diagram comparing a ramp signal shown in FIG. 2 with a sensing signal.

FIG. 3 is a graph depicting a decreasing ramp signal and a related sensing signal according to the description given above in relation to FIG. 2. In FIG. 3, the x-axis represents time and the y-axis represents voltage level.

Referring to FIGS. 1, 2 and 3, the ramp signal generator 33 generates a ramp signal $V_{RAMP}$ in response to a control signal RON from the timing controller 10. The ramp signal $V_{RAMP}$ according to the illustrated embodiment of the inventive concept decreases at a regular rate over a defined period of time.

When the comparator 31 compares the sensing signal $V_{FD}$ with the ramp signal $V_{RAMP}$, the timing controller 10 activates the control signal CLK to activate the counter 32.

Before a time point $t_{latch}$, a voltage level of the sensing signal $V_{FD}$ is lower than that of the ramp signal $V_{RAMP}$. However, after the time point $t_{latch}$, the voltage level of the sensing signal $V_{RAMP}$ is lower than that of the ramp signal $V_{FD}$. At this point, the comparator 31 activates a comparison signal $V_{LATCH}$. The timing controller 10 does not generate the control signal CLK when the comparison signal $V_{LATCH}$ is activated. Thus, the operation of the counter 32 is stopped. A counted value obtained when the counter 32 is stopped in the digital data equivalent to the level of the sensing signal $V_{FD}$.

Continuing with FIGS. 1 and 2, the timing controller 10 activates the control signal TX to transfer the sensing signal $V_{FD}$ transferred from the photodiode PD to the sensing node FD. The pixel 20 transfers the sensing signal $V_{DD}$ corresponding to external image information to the comparator 31.

The comparator 31 performs a digital double sampling (DDS) to accurately convert the analog signal provided by the pixel 20 into a corresponding digital signal. A difference between digital data Dsig and digital data Drst (Dsig-Drst) is obtained by performing the DDS. The digital data Drst is obtained by digitally converting an analog signal when a pixel is initialized to convert an accurate analog signal from the pixel into digital data. The digital data Dsig is obtained by digitally converting an analog signal corresponding to an external image signal from a pixel receiving the image signal.

The comparator 31 of FIG. 2 comprises a capacitor $C_{off}$, transistors $M_p$, $M_{off}$, $M_{SF2}$, $M_{SEL2}$, and $M_{C2}$, and current sources $I_b$ and $I_{b2}$.

The transistor $M_p$ is coupled between the power supply voltage $V_{DD}$ and a source of the transistor $M_{off}$ and controlled by a drain of the transistor $M_{off}$. The transistor $M_{off}$ is coupled between the capacitor $C_{off}$ and a drain of the transistor $M_p$ and controlled by a control signal RSTn. When the control signal RSTn is activated, the transistor $M_p$ is diode-connected. That is, a drain and a source are connected to the transistor $M_p$.

The capacitor $C_{off}$ is connected to a drain of the transistor $M_{off}$. That is, the capacitor $C_{off}$ stores a regular voltage level (i.e., reset offset) formed by the diode-connected transistor $M_p$.

For instance, when a control signal RST is activated, the sensing node FD is initialized. In addition, the control signal RSTn is activated to remove deviation of reset offset between the pixels 20. The capacitor $C_{off}$ stores the sum of a threshold voltage $\Delta_T$ of the diode-connected transistor $M_p$ and a saturation voltage $\Delta_{SAT}$ of the transistor $M_p$. An output voltage $V_C$ of the comparator 31 is also determined as $V_T+\Delta_{SAT}$. That is, the voltage level of the initialized sensing node FD is always determined as $V_T+\Delta_{SAT}$. Accordingly, the deviation of reset offset between pixels may be prevented.

The transistor $M_{SF2}$ is coupled between the drain of the transistor $M_p$ and a drain of the transistor $M_{SEL2}$ and controlled by the ramp signal $V_{RAMP}$. The transistor $M_{SF2}$ matches the transistor $M_{SF1}$.

The transistor $M_{SEL2}$ is coupled between the current source $I_b$ and a source of the transistor $M_{SF2}$ and controlled by the power supply voltage $V_{DD}$. That is, the transistor $M_{SEL2}$ is added to match the transistor $M_{SEL1}$.

The transistor $M_{C2}$ is coupled between the power supply voltage and the current source $I_{b2}$ and controlled by an output voltage $V_{C1}$ of the comparator 31. The transistor $M_{C2}$ buffers the output voltage $V_{C1}$ of the comparator 31.

Generally, reset offset of the comparator 31 is set by a voltage level of an initialized sensing node FD. According to a digital double sampling (DDS) method, reset offset of a comparator may be removed but the size of a maximum input signal may decrease as much as the size of the reset offset. In addition, when the size of the reset offset increases, an output of the comparator may be biased toward a power supply voltage VDD or a ground voltage VSS. Accordingly, the reset offset of the comparator 31 is set to a predetermined low voltage level.

Figure 4:
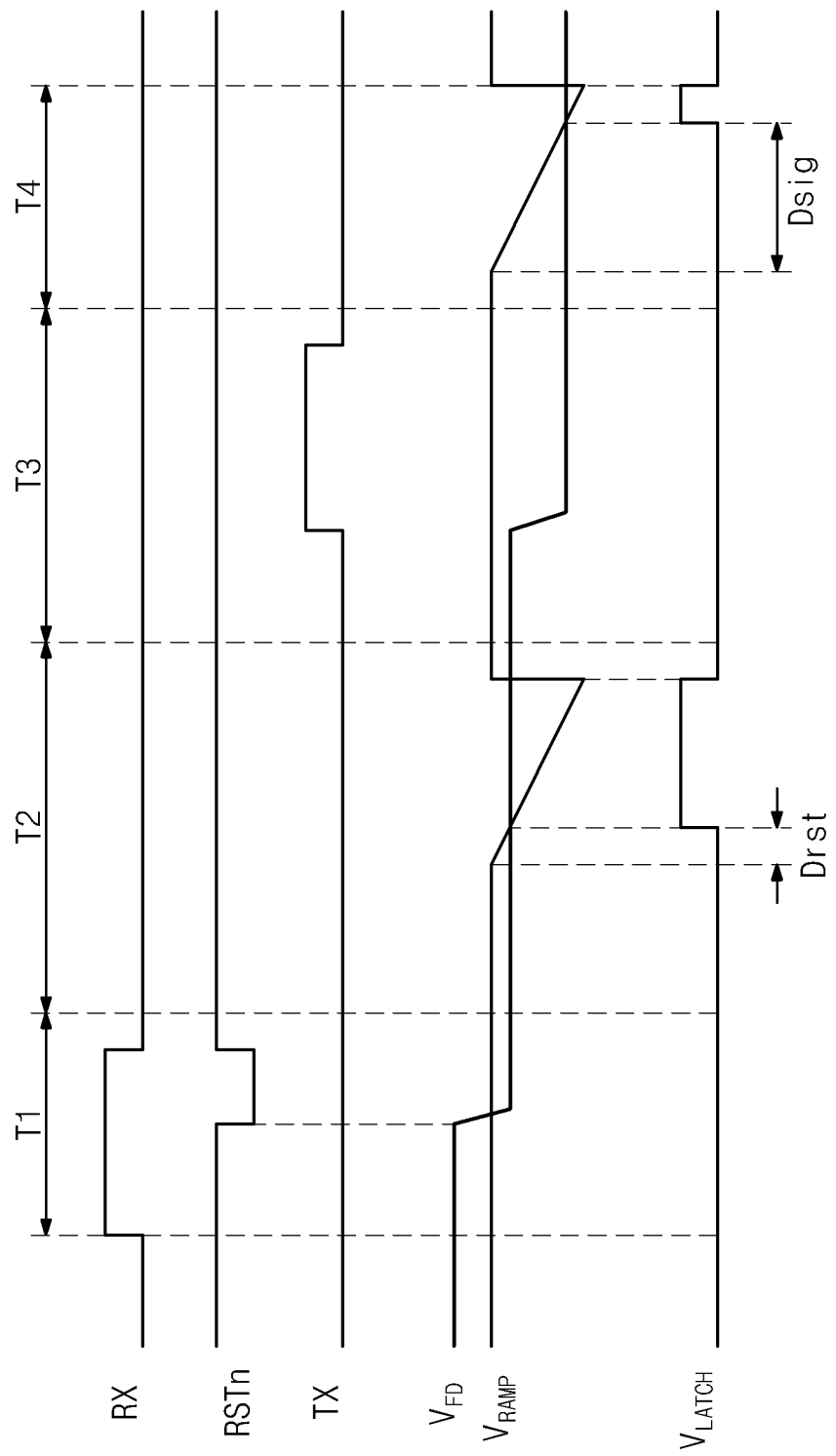
FIG. 4 is a timing diagram illustrating operations of the pixel and the comparator shown in FIG. 2.

A more detailed description of the operations of the pixel 20 and comparator 31 shown in FIG. 2 will now be given with reference to the timing diagram of FIG. 4.

Referring to FIGS. 1, 2, 3 and 4, the operation of the CMOS image sensor according to certain embodiments of the inventive concept may be divided into an initialization mode and an image input mode. During the initialization mode, a pixel is initialized (T1) and a voltage corresponding to the initialized pixel is analog-to-digital converted (T2). During the image input mode, external image information is transferred to the pixel (T3) and a voltage corresponding to the external image information is analog-to-digital converted (T4).

During the time periods T1 and T2, the comparator 31 compares a sensing signal $V_{FD}$ having a predetermined voltage level with a ramp signal $V_{RAMP}$ and transfers a comparison signal $V_{LATCH}$ to the timing controller 10. The timing controller 10 receives the comparison signal $V_{LATCH}$ to generate control signals CLK and RST. The counter 32 converts the sensing signal $V_{FD}$ having a predetermined voltage level into a digital signal Drst in response to the control signals CLK and RST. The conversion of an analog signal into digital data by initialization of the pixel array 20 is determined as the digital data Drst.

During the time period T3, the photodiode PD senses the external image signal. When the control signal TX is activated, the sensed signal $V_{FD}$ is transferred to the sensing node FD.

During the time period T4, the comparator 31 compares the sensed signal $V_{FD}$ with the ramp signal $V_{RAMP}$ and transfers eth comparison signal $V_{LATCH}$ to the timing controller 10. The timing controller 10 receives the comparison signal $V_{LATCH}$ to generate control signals CLK and RST. The counter 32 converts a sensing signal $V_{FD}$ having a predetermined voltage level into a digital signal Dsig in response to the control signals CLK and RST. The conversion of an analog signal into a digital signal by external image information is determined as digital data Dsig. That is, digital double sampling is a procedure for obtaining a value between digital data Drst and digital data Dsig.

Figure 5:
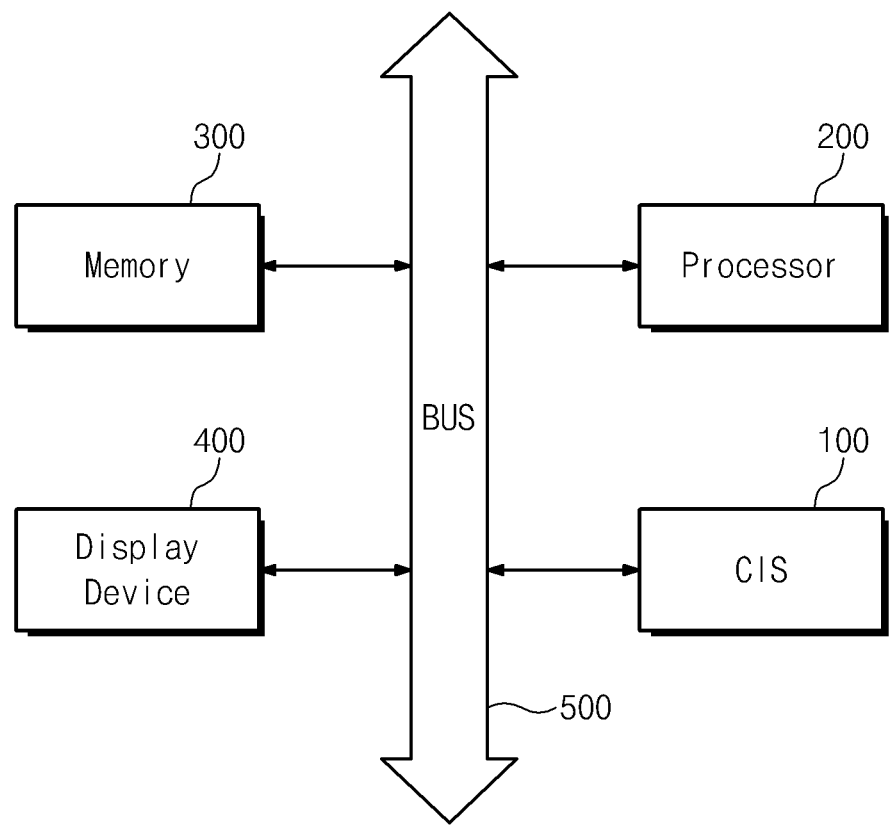
FIG. 5 is a block diagram of a digital camera system including a CMOS image sensor.

FIG. 5 is a block diagram of an exemplary digital camera system including a CMOS image sensor.

Referring to FIG. 5, the digital camera system includes a CMOS image sensor 100, a processor 200, a memory 300, a display 400, and a bus 500. As illustrated in FIG. 1, the CMOS image sensor 100 captures external image information in response to the control by the processor 200. The CMOS image sensor 100 may include the same structure as shown in FIGS. 1 and 2.

The processor 200 stores the captured image information in the memory 300 through the bus 500. The processor 200 also outputs the image information to the display 400 from the memory 300.

As explained so far, according to the inventive concept, reset offset deviation between pixels is prevented. In addition, a sensing signal is directly input to a comparator to expand a dynamic range of the sensing signal and reduce noise.

While the inventive concept has been described with reference to exemplary embodiments, it will be apparent to those skilled in the art that various changes and modifications may be made without departing from the scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A CMOS image sensor comprising:
a photodiode;
a switch configured to transfer a signal sensed by the photodiode to a sensing node; and
a comparator electrically and directly connected to the sensing node and configured to compare the sensed signal of the sensing node and a ramp signal,
wherein reset offset of the comparator is maintained at a constant offset voltage level during an initialization mode,
wherein the switch comprises an RX transistor configured to initialize the sensing node, a TX transistor configured to transfer the signal sensed by the photodiode to the sensing node, an SF1 transistor controlled by the sensed signal; and an SEL1 transistor configured to select the sensing node, and
wherein the comparator comprises an $M_p$ transistor configured to be diode-connected during the initialization mode, an $M_{off}$ transistor configured to make diode-connected $M_p$ transistor in response to an initialization signal, and an offset capacitor configured to store a voltage level made by the diode-connected $M_p$ transistor.

2. The CMOS image sensor of claim 1, further comprising:
a counter configured to output digital data corresponding to the sensed signal according to a comparison result transferred from the comparator.

3. The CMOS image sensor of claim 2, further comprising:
a timing controller configured to control the switch, the comparator, and the counter; and
a ramp signal generator configured to output the ramp signal in response to control of the timing controller.

4. The CMOS image sensor of claim 1, wherein the comparator further comprises:
an SF2 transistor matching in impedance with the SF1 transistor and controlled by the ramp signal; and
an SEL transistor matching in impedance with the SEL1 transistor and controlled by a power supply voltage.

5. The CMOS image sensor of claim 1, wherein the offset voltage level includes the voltage level stored in the offset capacitor.

6. The CMOS image sensor of claim 1, wherein the sensing node is initialized by a power supply voltage during the initialization mode.

7. The CMOS image sensor of claim 1, wherein the reset offset of the comparator is independent of reset offset of the sensing node.

8. The CMOS image sensor of claim 1, wherein the ramp signal decreases over a defined time period.

9. A method of detecting an image signal using a CMOS image sensor, the method comprising:
initializing a sensing node and setting a reset offset corresponding to the initialized sensing node to a predetermined voltage level; and
converting the predetermined voltage level into a digital signal,
wherein an RX transistor initializes the sensing node, a TX transistor transfers the signal sensed by the photodiode to the sensing node, an SF1 transistor is controlled by the sensed signal, and an SEL1 transistor selects the sensing node, and wherein an $M_p$ transistor of a comparator is diode-connected during the initialization mode, an $M_{off}$ transistor of the comparator makes diode-connected $M_p$ transistor in response to an initialization signal, and an offset capacitor stores a voltage level made by the diode-connected $M_p$ transistor.

10. The method of claim 9, wherein initializing a sensing node comprises applying a power supply voltage to the sensing node.

11. The method of claim 9, wherein the reset offset is independent of a voltage level of the initialized sensing node.

12. The method of claim 9, wherein converting the predetermined voltage level into a digital signal comprises:
   comparing the predetermined voltage level with a ramp signal; and
   performing a counting operation while comparing the predetermined voltage level with the ramp signal.

13. The method of claim 12, wherein the ramp signal decreases over a defined time period during which the counting operation is performed.

14. The method of claim 9, further comprising:
   transferring external image information to the sensing node after receiving the external image information; and
   converting the external image information into a digital signal.

15. The method of claim 14, wherein transferring external image information to the sensing node after receiving the external image information comprises:
   receiving the external image information to generate a sensed signal; and
   transferring the sensed signal to the sensing node.

16. The method of claim 14, wherein converting the external image information into a digital signal comprises:
   comparing the external image information with a ramp signal; and
   performing the counting operation while comparing external image information with the ramp signal.

17. The method of claim 16, wherein the ramp signal decreases over a defined time period during which the counting operation is performed.

* * * * *